US010896731B1

(12) United States Patent
Li et al.

(10) Patent No.: US 10,896,731 B1
(45) Date of Patent: Jan. 19, 2021

(54) CONTENT ADDRESSABLE MEMORY CIRCUITS WITH THRESHOLD SWITCHING MEMRISTORS

(71) Applicant: Hewlett Packard Enterprise Development LP, Houston, TX (US)

(72) Inventors: Can Li, Palo Alto, CA (US); Catherine Graves, Palo Alto, CA (US); John Paul Strachan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/526,455

(22) Filed: Jul. 30, 2019

(51) Int. Cl.
*G11C 15/04* (2006.01)
(52) U.S. Cl.
CPC .................................. *G11C 15/04* (2013.01)
(58) Field of Classification Search
CPC ......... G11C 15/00; G11C 15/04; G11C 11/56; G11C 13/0002; G06F 11/1064
See application file for complete search history.

(56) References Cited

U.S. PATENT DOCUMENTS

| | | | |
|---|---|---|---|
| 9,543,013 B1* | 1/2017 | Govindaraj | G11C 15/02 |
| 2005/0169095 A1* | 8/2005 | Bedeschi | G11C 13/0026 365/232 |
| 2016/0284408 A1* | 9/2016 | Chiou | G11C 15/046 |
| 2018/0040374 A1* | 2/2018 | Zheng | G11C 15/046 |

* cited by examiner

*Primary Examiner* — Ajay Ojha
(74) *Attorney, Agent, or Firm* — Sheppard Mullin Richter & Hampton LLP

(57) ABSTRACT

A content addressable memory (CAM) structure is provided. The CAM comprises a plurality of CAM cells communicatively coupled to processing circuitry. A plurality of threshold switching (TS) memristors are included, each configured to connect to a one of the plurality of CAM cells, with the first end connected to the CAM cell and the second connected to a match line. A discharge transistor is included and configured to discharge any charge on the match line in response to the CAM receiving a command to perform a search.

20 Claims, 12 Drawing Sheets

CONTENT ADDRESSABLE MEMORY CIRCUITS WITH THRESHOLD SWITCHING MEMRISTORS

STATEMENT OF GOVERNMENT INTEREST

This invention was made with Government support. The Government has certain rights in the invention.

DESCRIPTION OF RELATED ART

Content addressable memory (CAM) is a type of memory that can perform a search operation in which a data string may be input as search content and the resulting output is an address of a location in the memory that stores matching data. This is in contrast to a read operation in which an address is input and the resulting output is the data stored in the memory location corresponding to the searched address. Certain CAMs may be able to perform both the aforementioned search operation and the aforementioned read operation, while non-CAM memories may be able to perform the read operation but not the search operation.

Ternary CAM (TCAM) is a type of CAM in which the bit cells can store a wildcard data value in addition to two binary data values. When a bit cell that stores the wildcard value is searched, the result is a match regardless of what search criterion is used to search the bit cell. Certain TCAMs may also allow a search to be conducted on the basis of a wildcard search criterion. When a bit cell is searched based on the wildcard search criterion, the result is a match regardless of what value is stored in the bit cell.

Memristors are devices that may be used as components in a wide range of electronic circuits, such as memories, switches, radio frequency circuits, and logic circuits and systems. In a memory structure, a crossbar array of memory devices having memristors may be used. In memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states-one in which the channel forms an electrically conductive path ("on") and one in which the channel forms a less conductive path ("off"). In some other cases, conductive paths represent "off" and less conductive paths represent "on." Furthermore, memristors may also behave as an analog component with variable conductance.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

Content addressable memory (CAM) is a hardware that compares the input pattern against the stored binary data. The stored data of a CAM is not accessed by its location but rather by its content. A word, or "tag," is input to the CAM, the CAM searches for the tag in its contents and, when found, the CAM returns the address of the location where the found contents reside. CAMs are powerful, efficient, and fast. The input patterns and data in CAMs are represented by logic '0's and logic '1's (generally referred to as a binary CAM). Reading, writing, and comparing are the three main modes of operation for CAMs. Data stored in CAMs represents the memory address in random-access memory (RAM) where the underlying data sought is stored. If the data in RAM is to be accessed, the CAM is searched for the address associated with that desired data, with the memory address being retrieved from the CAM. In a binary CAM, an input search word is compared to a table of stored words through search lines and, if a match is found for the input search word in the stored CAM words, the CAM returns the address of the matching data to an encoder. If no match is found in any of the stored words, no match is indicated on the match lines and, in some cases, a flag may be triggered indicating the miss.

CAMS can be categorized as "binary" or "ternary." A binary CAM (BCAM) operates on an input pattern containing binary bits of logic '0' and logic '1.' A ternary CAM (TCAM) operates on an input pattern (and stores data) containing not only binary bits of logic '0' and logic '1' but also an 'X' value, commonly referred to as a "wildcard" or a "don't care bit." In this way, TCAMs allows for additional complexity, as the search is allowed to search not only for direct matches to the binary inputs ('0's and '1's) but also allows the addition of so-called "don't care" bits, allowing for a bit to be either a logical '0' or logical '1' for a match. Thus, a search on an input pattern such as "10X1" in a TCAM would return a match for both "1001" and "1011."

Figure 1:
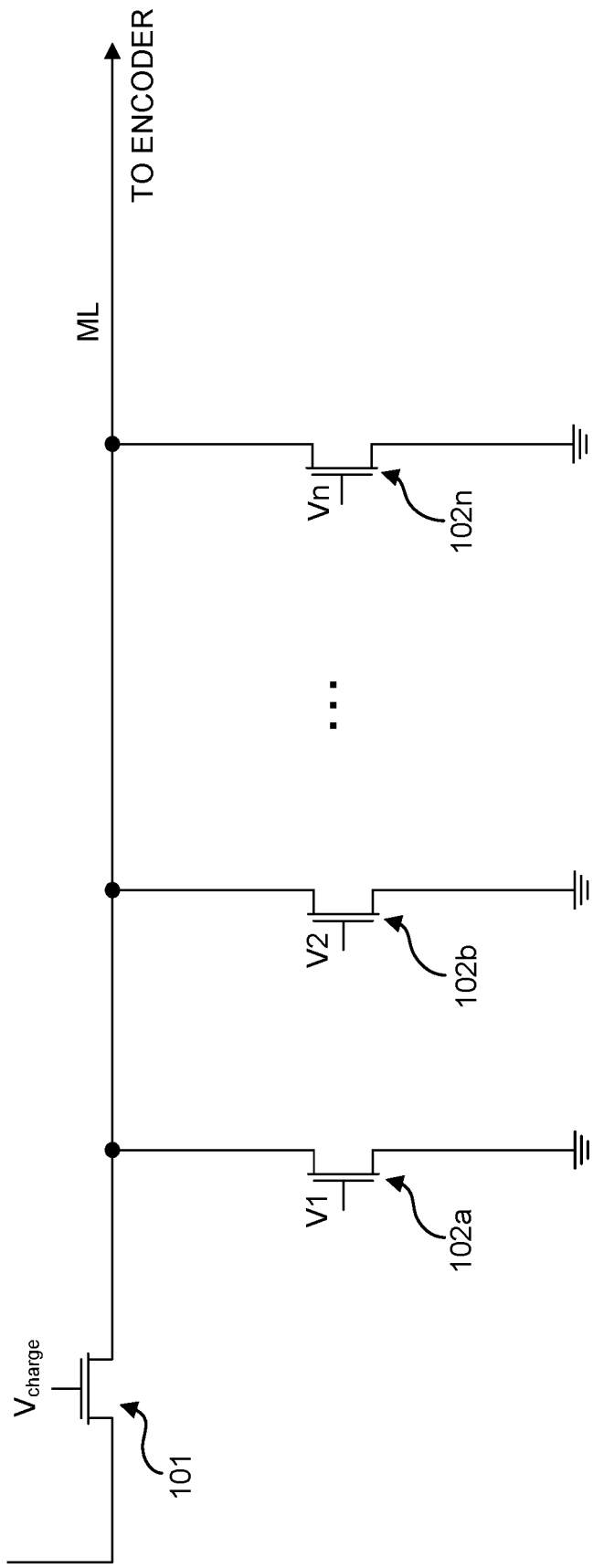
FIG. 1 shows an example diagram illustrating prior art pull-down match-line transistors within a content addressable memory.

Each bit cell of a CAM or TCAM is connected to a match line (ML) via a pull-down transistor (or match-line transistor). FIG. 1 is an example diagram illustrating prior art pull-down match-line transistors within a CAM, to illustrate the use of pull-down transistors. In conventional CAMs and TCAMs, the MLs are pre-charged to be at a high level (indicative of a match). Pre-charging occurs prior to conducting any search by applying a voltage $V_{charge}$ to the gate of a pre-charge transistor 101. Applying the voltage $V_{charge}$ to the gate causes the pre-charge transistor 101 to create a path from a match-line driver (not shown in FIG. 1) attached to the ML and configured to apply a voltage corresponding to a match. In this way, ML is pre-charged to a high state, consistent with indicating a match to an encoder (not shown in FIG. 1) on the opposite end of the row containing the plurality of bit cells representing a data word. During a search, if the search input (or comparand) does not match a data word stored in the bit cells representing a word storage block (i.e., the bit cells along a row in an array of bit cells making up the CAM), the state of the match-line transistor of a the mismatched bit cell is changed (i.e., from OFF to ON), thereby pulling the voltage on the associated ML down (i.e., going from HIGH to LOW) to indicate a mismatch. As seen in FIG. 1, a plurality of pull-down-type match-line transistors 102*a*-n can be connected to the same match line ML, each having its own gate voltage V1-Vn. In various embodiments, one or more match-line transistors 102*a-n* can be associated with the same bit cell.

A major limitation for CAMs and TCAMs is word length. The use of the pull-down match-line transistors limits the ability for CAMs or TCAMs to search longer words at once, instead requiring that larger words (e.g., 72-bit words) be broken into different 8-bit or 16-bit chunks. This limitation arises due to the non-zero sub-threshold current leakage of match-line transistors connected to the same match line ML. As the number of bit cells are connected to the same match line ML the additive sub-threshold leakage current from each pull-down match-line transistor provides a path for discharge of the match line ML. Therefore, an erroneous indication of a mismatch (i.e., a false-negative) can be sensed on match line ML. Therefore, the number of bit cells on a particular match line ML must be limited using traditional match-line transistors, resulting in the need for a greater number of chunks and the use of logical addition of each search result of the plurality of chunks to maintain performance of the CAM or TCAM. Due to this leakage, the readout margin between a "match" case and a "mismatch" case is reduced, yielding incorrect results and interfering with efficient operation of the CAM or TCAM. In some instances, the sub-threshold leakage can change the search range, leading to inaccuracies in bit cell operation.

Embodiments of the present disclosure addresses the issue of sub-threshold current leakage by changing the standard approach to match lines. As discussed in greater detail below, embodiments of the technology disclosed herein replaces the traditional pull-down-type match-line transistor with a threshold switching (TS) memristor. TS memristors exhibit a significantly smaller conductance swing than traditional MOSFET transistors, thereby greatly decreasing the sub-threshold current leakage on the ML. Conductance swing is defined as the ratio between the logarithmical of the conductance change and the change of applied voltage during the conductance switching. For silicon-based three terminal MOSFET transistors, the applied voltage is usually the gate voltage (which triggers the conductance switching), and the conductance swing is usually called a subthreshold swing. The physical lower bound of the swing for traditional silicon-based three terminal MOSFET transistors is greater than 60 mV/decade, even when a low voltage is applied to the gate. For the TS memristor, the applied voltage is the top electrode voltage, which triggers the conductance switching. Unlike three terminal MOSFET transistors that relies on the gate voltage to control the resistance between the source and drain terminals, the TS memristor's resistance is controlled directly by the voltage across the TS memristor (i.e., from a top electrode to a bottom electrode of the device). Because the applied voltage is directly applied to the top electrode, rather than a third terminal (i.e., the gate of a three terminal MOSFET), the physical lower bound of the swing for the TS memristors is less than 1 mV/dec. The fundamentally different physical conduction mechanism of the TS memristors enables the small physical lower bound of the subthreshold swing and thus leakage through the device at low voltages (i.e. match conditions). Even when the gate terminal of a MOSFET is held low, there is still significant conduction between source and drain terminals which lead to significant leakage currents. However for TS memristors the conductance is controlled directly by the voltage applied to a terminal defining the path, significantly reducing this leakage current. Non-limiting examples of TS memristors include diffusive memristors, metal-insulator transition (MIT) devices, Zener diodes, mixed ionic-electronic conducting (MIEC) devices, among others. Through the use of TS memristors, longer word lengths for binary CAM, TCAM, and analog CAM cell designs are achievable, greatly increasing overall efficiency and enabling larger search criteria. The greater word length is enabled by replacing the pull-down match-line transistors with pull-up TS memristors. The ability to search longer word lengths in the TCAM reduces the need to break up long search inputs (e.g., a 72-bit word into 8-bit or 16-bit chunks) and relying on logical addition of the results from the multiple chunks to maintain performance. Moreover, using TS memristors in accordance with the present disclosure allows for more stages in multi-stage search schemes and the sharing of peripherals (e.g., match-line sense amplifiers (MLSA), multiple-match resolver (MMR), voltage drivers, current sensing circuits, etc.) for power and area savings.

Figure 2A:
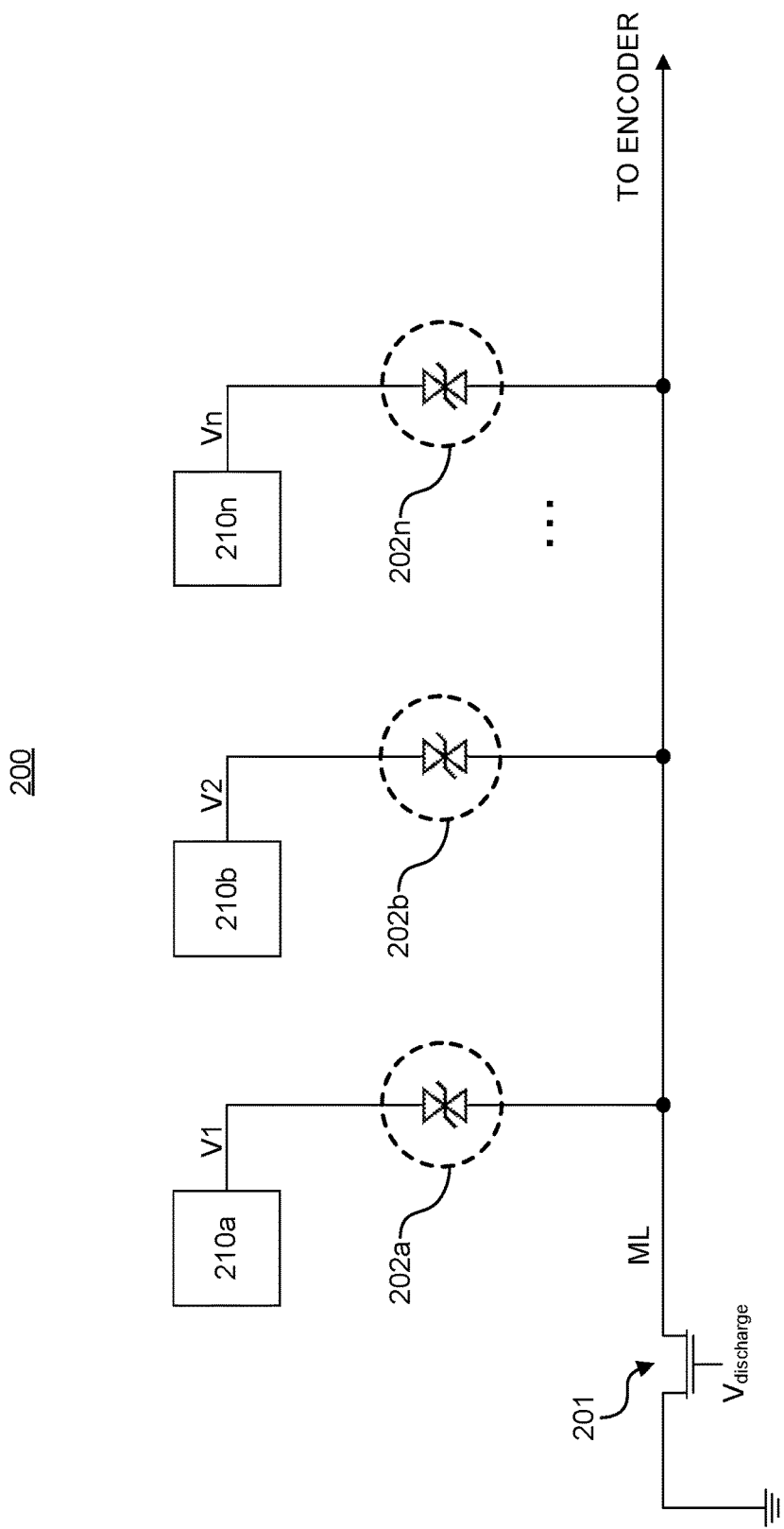
FIG. 2A illustrates an example row of an array of bit cells in accordance with embodiments of the technology disclosed herein.

FIG. 2A illustrates an example row 200 of an array of bit cells 210*a-n* in accordance with embodiments of the technology disclosed herein. In various embodiments, bit cells 210*a-n* can comprise a BCAM bit cell, a TCAM bit cell, an analog CAM cell, or any other type of bit call that may be used in a CAM-type circuit. In various embodiments, each bit cell may be static random-access memory (SRAM)-based, dynamic RAM (DRAM)-based, or memristor-based, without changing the operation of TS memristor embodiments of the technology disclosed herein. Each CAM-type circuit comprises a plurality of bit cells 210, arranged in an array having a plurality of rows, such as example row 200 illustrated in FIG. 3. The bit cells along a given row are connected to the same match line ML through a TS memristor. The number of bit cells per match line ML can be equal to a search unit size for the CAM (i.e., a word size), the bit cells 210 connected to the same match line ML forming a word storage block. For example, the bit cells 210*a-n* of row 300 form a word storage block for a first data word having n bits, each bit cell 210*a-n* connected to match line ML through TS memristors 202*a-n*. A first end of each TS memristor 202*a-n* connects with an output (not shown in FIG. 2A) of each bit cell 210*a-n*. In various embodiments, the output of each CAM cell 210*a-n* comprises one or more wiring lines (e.g., electrical traces) over which the CAM cell 210*a-n* indicates the result of the search operation.

Unlike circuits utilizing the conventional pull-down transistors on the match line discussed with respect to FIG. 1, match line ML of row 300 is not set to a high voltage state prior to a search (i.e., pre-charged). Rather, prior to a search being conducted, match line ML is discharged to ground by switching a discharge transistor 201 from an OFF state to an ON state, thereby creating a path to ground for match line ML. In other words, match line ML is "pre-drained" rather than "pre-charged" before a search. Rather than a mismatch being indicated by pulling the voltage on match line ML down, each TS memristor remains in an OFF state until a mismatch is detected. Only upon detection of a mismatch is a respective TS memristor 202 turned to the ON state, thereby leading to a current that charges the parasitic capacitance on match line ML, resulting in the voltage on match line ML increasing (i.e., being pulled-up). The increased voltage makes it more difficult for other TS memristors 202 to be turned on due to the decrease in the voltage drop across each TS memristor and the much lower subthreshold leakage of the two-terminal TS memristor compared to traditional three-terminal transistors (because of the much lower subthreshold swing discussed above). Moreover, the potential difference between the match line ML and the bit cell is much lower than in the traditional pull-down transistor approach because the match line ML is not carrying a high-logic voltage (i.e., not pre-charged), but is only charged if a mismatch occurs and the match line ML voltage is pulled up.

Figure 2C:
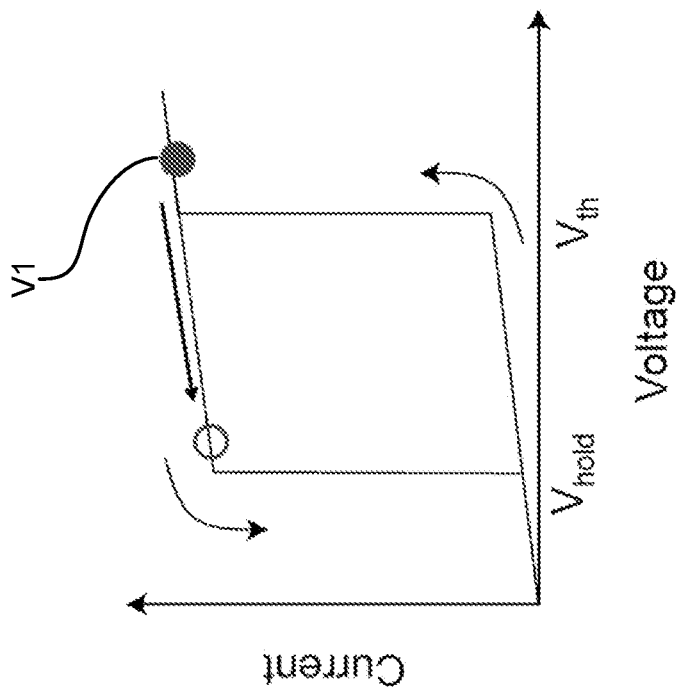
FIG. 2C shows another chart illustrating operation of example TS memristors in accordance with embodiments of the technology disclosed herein.
Figure 2B:
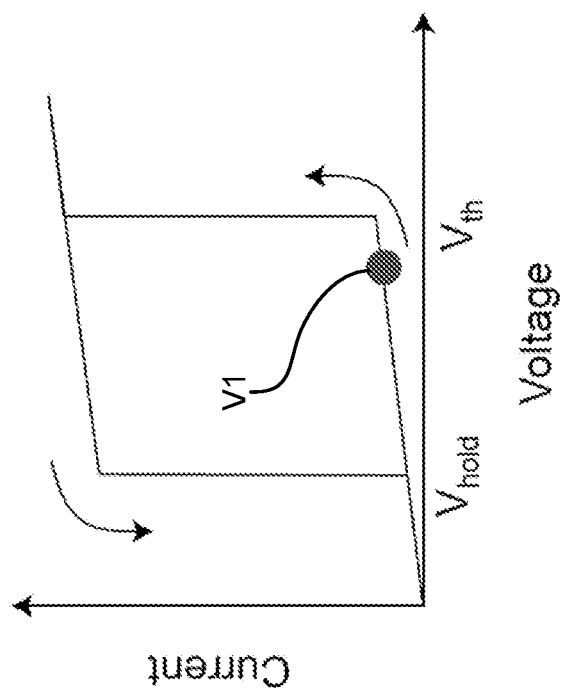
FIG. 2B shows a chart illustrating operation of example TS memristors in accordance with embodiments of the technology disclosed herein.

FIGS. 2B and 2C illustrate the operation of example TS memristors 202a-n of FIG. 2A. The graphs in FIGS. 2B and 2C are provided for illustrative purposes only and should not be interpreted as limiting the scope of the technology disclosed herein. For ease of discussion, operation of example TS memristors 202a-n shall be discussed with respect to TS memristor 202a of FIG. 2A. Each graph in FIGS. 2B and 2C illustrate the voltage level of the first voltage V1 during a search operation. Although discussed with respect to first voltage V1, the same principles of operation apply to all TS memristors 202a-n within a given CAM implementation. As shown in FIG. 2B, while first voltage V1 remains below the threshold voltage $V_{th}$ of TS memristor 202a it remains in an OFF state. In other words, TS memristor 202a remains in a high resistance state so that first voltage V1 cannot reach match line ML and charge it up (indicating a mismatch). When all of the input voltages V1-Vn are smaller than the threshold voltage $V_{th}$ of the TS memristors 202a-n all the TS memristors 202a-n are in the OFF state. As such, the readout on match line ML will remain low because match line ML was discharged at the beginning of the search operation. The threshold voltage $V_{th}$ represents the voltage difference across the TS memristor required to change its conductive state (e.g., go from a high resistance state to a low resistance state).

If one of the input voltages (e.g., first voltage V1) does exceed the threshold voltage $V_{th}$, the respective TS memristor (e.g., TS memristor 202a) is turned to the ON state, as seen in FIG. 2C. As shown, once first voltage $V_1$ exceeded the threshold voltage $V_{th}$ the current level spiked, indicating that TS memristor 202a was turned ON, creating a path between the bit cell 210a and match line ML of FIG. 2A. In this way, the parasitic capacitance on match line ML is charged, resulting in match line ML being charged and indicating a mismatch. TS memristor 202a remains in the ON state while first voltage V1 remains above a hold voltage $V_{hold}$, which represents the minimum current level required for TS memristor 202a to be in the ON state. Once first voltage V1 falls below the hold voltage $V_{hold}$, TS memristor 202a is turned to the OFF position, severing the path between bit cell 210a and match line ML (as indicated by the down edge of FIG. 2C). The resulting voltage on match line ML after this cycle is first voltage V1 minus the hold voltage $V_{hold}$, which can be detected as a high logic level. In this way, even after TS memristor 202a is switched to OFF, match line ML will still register the mismatch identification for bit cell 210a. Moreover, because of the increase of voltage on match line ML, it is more difficult for the other TS memristors 202b-n to turn to the ON position because there is a smaller voltage drop across the TS memristor. Therefore, the probability of the other input voltages V2-Vn causing a switch event (e.g., TS memristor turning from OFF to ON) is reduced, reducing the number of switching events that may occur over time. This, in turn, results in less stringent requirements on device endurance and saves power by reducing the number of devices that need to be charged high.

As stated above, the TS memristors can include diffusive memristors, metal-insulator transition (MIT) devices, Zener diodes, mixed ionic-electronic conducting (MIEC) devices, among others in various embodiments. TS memristors are volatile devices, meaning that each TS memristor retains its conductance state only when the voltage applied to the TS memristor exceeds the hold voltage $V_{hold}$. After the voltage returns to zero, the conductance of TS memristors returns to a high resistance state (i.e., back to the OFF state). This is unlike the memristors used for non-volatile storage within each CAM cell in memristor-based CAM embodiments. Storage memristors are constructed such that they are capable of maintaining or "storing" a resistance level defining the threshold voltage, and this level is stored or maintained even when any voltage is removed from the device. In this way, the storage memristors are configured to provide the same output each time the voltage exceeds the threshold. For TS memristors, however, the resistance is not "set" like a storage memristor. Because the TS memristor is not being used to store any information (only has a physically defined $V_{threshold}$ or $V_{hold}$), it does not need to be programmed as such. Instead, each TS memristor can be constructed with a threshold voltage that is determined simply to ensure that a mismatch is indicated correctly, rather than being specifically programmed to provide a particular type of output current given specific input voltages.

Figure 3:
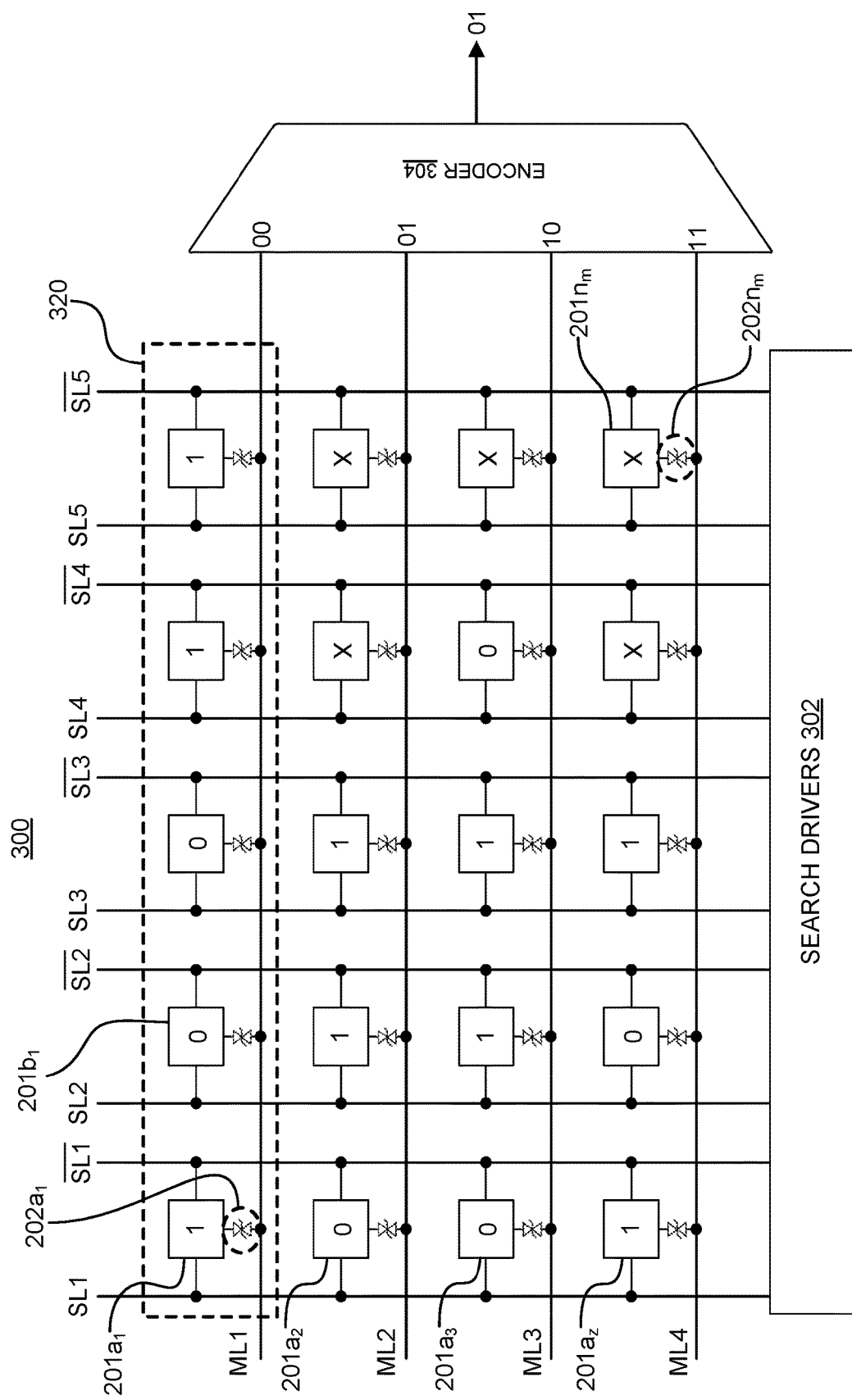
FIG. 3 illustrates an example content addressable memory with TS memristors in accordance with embodiments of the technology disclosed herein.

FIG. 3 illustrates an example CAM 300 in which embodiments of the TS memristor-connected bit cells may be implemented, in accordance with the technology disclosed herein. As illustrated, CAM 300 comprises an N×M array of bit cells, arranged in a plurality of rows, where N (or n) is the number of columns and M (or m) is the number of rows. For ease of discussion, each row shall be discussed as being similar to and operating like example row 200 discussed with respect to FIGS. 2A-2C. Where common references are used in multiple figures the description herein corresponding to such common references shall be interpreted as applying to all instances of the common reference in any figures unless explicitly stated otherwise.

As seen in FIG. 3, the CAM 300 comprises a plurality of bit cells $201a_1$-$201n_m$. Each bit cell 201 can comprise both storage and comparison circuitry. As discussed above, each bit cell $201a_1$-$201n_m$ represents a bit of respective stored data word corresponding to the respective row (i.e., word storage block). For example, the five horizontal bits 320 represents a single data word, used to represent one or more addresses within an associated random access memory (RAM) or other storage media of a computing device implementing the example CAM 300. Each horizontal collection of bits represents a different stored data word of CAM 300. Match lines ML1-ML4 run horizontally between the data words, and indicate whether the bit of the search word (i.e., comparand) match the bits stored in the bit cells $201a_1$-$201n_m$ of any one of the horizontal data words. As shown, each bit cell $201a_1$-$201n_m$ is connected to a respective match line ML1-ML4 through a respective TS memristor $202a_1$-$202n_m$. In various embodiments, one or more TS memristors 202 may be associated with a single bit cell $201a_1$-$201n_m$, as illustrated with respect to the example bit cell of FIG. 4B.

Each match line ML1-ML4 can be coupled to inputs of an encoder 304 to generate an address corresponding to a matched data word. In various embodiments, each bit cell $201a_1$-$201n_m$ can be set or reset to represent either a logic '0,' a logic '1,' or (as a ternary CAM) a "don't care" bit (i.e., 'X'). In the illustrated embodiment, each destination address represented by the stored data word and a corresponding port to which data packets need be forwarded is represented in the routing table of Table 1.

TABLE 1

ROUTING TABLE

| Match Line (ML) No. | Address | Search Result | Output Port |
|---|---|---|---|
| 1 | 101XX | 00 | A |
| 2 | 0110X | 01 | B |
| 3 | 011XX | 10 | C |
| 4 | 10011 | 11 | D |

Because of the don't care bits, each of the first three data words (associated with match lines ML1, ML2, ML3, respectively) represents a range of input addresses allowing for more than one data word to indicate a match to the comparand where the non-don't care bits match the respective bit of the comparand. For example, the data word associated with match line ML1 indicates that all addresses within the range 10100 to 10111 are forwarded to port A. The comparand is input into a plurality of search drivers 302, each search driver associated with a column of bits of stored data words.

As discussed above, to perform a search operation, all of match lines ML-ML4 are discharged to ground, thereby causing each match line ML1-ML4 to be detected as a low logic level (indicating a "match"). This is opposite of the pre-charging currently used in CAMs. Once discharged, each search driver of search drivers 102 drive the respective bit of the comparand onto the first search line SL and second search line $\overline{SL}$ of the respective bit column. Each bit cell $201a_1$-$201n_m$ compares its stored bit against the bit on its corresponding search lines SL, $\overline{SL}$. Bit cells $201a_1$-$201n_m$ with matching data do not cause the voltage across its respective TS memristor $202a_1$-$202n_m$, and therefore do not affect the corresponding match line ML1-ML4 (i.e., matched bit cells $201a_1$-$201n_m$ do not pull up the corresponding match line ML1-ML4 from its discharged state). However, bit cells 110 with a mismatched bit with exceed the threshold voltage of its respective TS memristor $202a_1$-$202n_m$, resulting in a spike in the current and voltage on the associated match line ML1-ML4. This results in a high logic level on the match line, indicating a mismatch. The operation of TS memristors $201a_1$-$201n_m$ can occur in a manner similar to that discussed above with respect to FIGS. 2A-2C. Bit cells $201a_1$-$201n_m$ storing a don't care bit (i.e., 'X'), however, operate as if a match has occurred, never affecting the discharge state of the corresponding match line ML1-ML4 by failing to trigger a switching event for its associated TS memristor $202a_1$-$202n_m$. The aggregate result is that match lines ML1-ML4 are pulled up for any word that has at least one mismatch, thereby indicating an overall mismatch to encoder 304.

Where all of bit cells $201a_1$-$201n_m$ match the bits of the comparand, the corresponding match line ML1-ML4 remains in the low logic state (i.e., discharge state), indicating a match of the comparand to encoder 304. For example, in the illustrated embodiment of FIG. 3, match lines ML2 and ML3 remain in the discharged state (i.e., indicating a match), while the other match lines ML1 and ML4 are charged (i.e., pulled up from the discharge state) to indicate a mismatch. Encoder 304 can generate the search address location of the matching data (as identified in Table 1 above). As illustrated in FIG. 3, encoder 304 numerically selects the smallest numbered match line of the two activated match lines M2 and M3 (in the illustrated case, match line M2), generating the match address '01.' This match address is used as the input address to a RAM or other storage media that contains a list of output ports, as indicated in Table 1 above. The match address output of CAM 300 is used as a pointer, which is used to retrieve associated data from the RAM. The CAM search can be viewed as a dictionary lookup where the search data is the word to be queried and the RAM contains the word definitions. A search is conducted for the destination address of each incoming data packet to find the appropriate output port. For example, if the data packet has an incoming address of 01101, the address lookup matches both match line ML2 and ML3 in Table 1. Because match line ML2 has the most defined bits (i.e., the least number of matching don't care bits), match line ML2 is selected as indicating the most direct route to the destination.

Figure 4A:
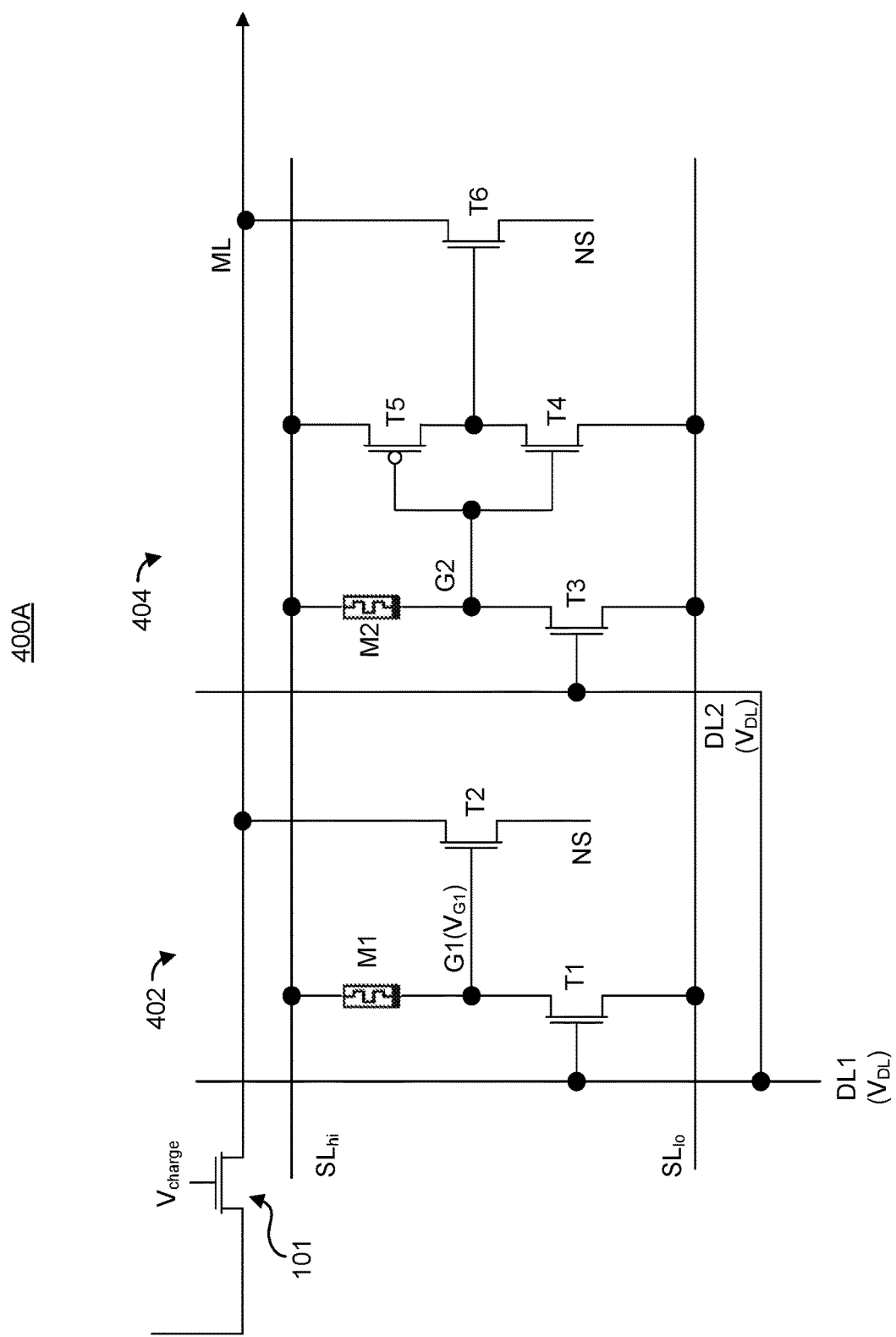
FIG. 4A shows a prior art analog content addressable memory (aCAM) cell.
Figure 4B:
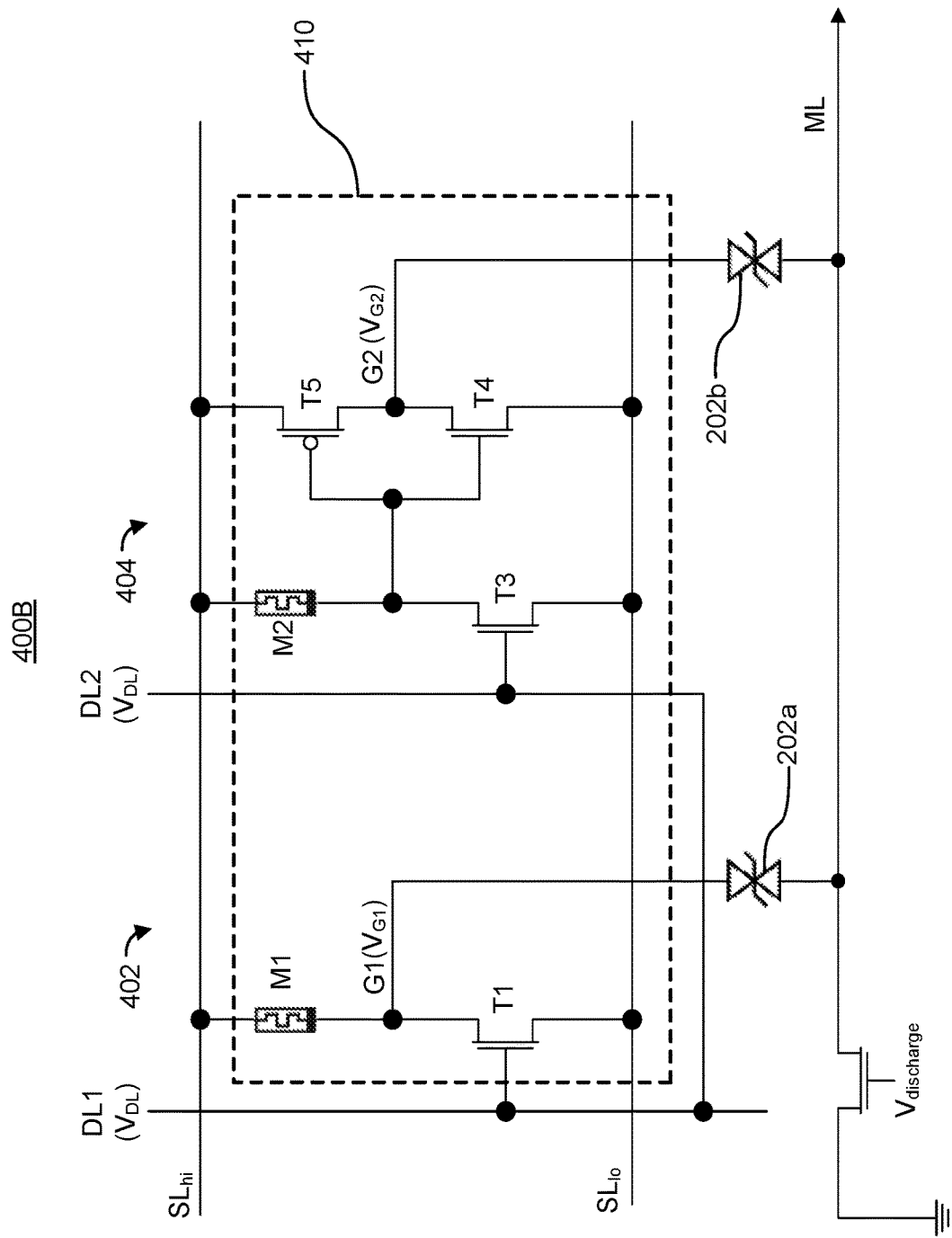
FIG. 4B shows an example TS memristor-based aCAM cell assembly in accordance with embodiments of the technology disclosed herein.

The specific design of the bit cells $201a_1$-$201n_m$ in the array does not impact the applicability of the TS memristor technology disclosed herein. Accordingly, TS memristors can be added to any known bit cell for any type of CAM to reduce the impact of subthreshold leakage and increase the overall available word length. FIGS. 4A and 4B show an example implementation of TS memristors with an analog CAM (aCAM) cell in accordance with embodiments of the present disclosure. FIGS. 4A and 4B are provided for illustrative purposes and should not be interpreted as limiting the scope of the technology to only the embodiment shown. FIG. 4A shows a prior art aCAM cell 400A, such as the aCAM cell discussed in co-pending U.S. patent application Ser. No. 16/274,379, filed Feb. 13, 2019, which is hereby incorporated by reference herein in its entirety. As shown, aCAM cell 400A is a six transistors and two memristors (6T2M) aCAM cell. An analog CAM circuit searches multilevel voltages and stores analog values in a nonvolatile memory (e.g., memristor). An aCAM cell outputs a match when the analog input voltage matches a certain range that is defined by the aCAM cell.

Each aCAM cell 400A can match all values between a "high value" and a "low value", or within a range, where the range includes non-binary values. These high and low values are set by programming memristors, and so are referred to as "$R_{high}$" and "$R_{low}$." The aCAM cell 410 includes a "high side" 402 and a "low side 404 (visually separated by second data line DL2. High side 402 and low side 404 are so-called because memristor M1 and memristor M2 are programmed to determine the values of $R_{high}$ and RN, respectively. The high side 402 includes a first transistor T1 and a first memristor M1. First memristor M1, in conjunction with first transistor T1, defines a first voltage divider and, when programmed, defines a high value $R_{high}$ of a range of values $R_{range}$. The high side 402 further includes a second transistor T2 with a first end connected to the match line ML, a second end connected to a rail (NS), and the gate is connected and controlled by common node G1. Low side 404 includes a third transistor T3, which defines a second voltage divider with second memristor M2. When second memristor M2 is programmed, second memristor M2 defines the low value $R_{low}$ of the range of values $R_{range}$. Fourth transistor T4 and fifth transistor T5 form an inverter, enabling high side 402 and low side 404 to be defined independently where first data line D1 and second data line D2 are tied together (as illustrated in FIG. 4). Low side 404 also includes a sixth transistor T6 with a first end connected to the match line ML, a second end connected to a rail (NS), and the gate is connected and controlled by the output node of the inverter (T4/T5). A mismatch is indicated by pulling down the voltage on the match line ML when the voltage at common node G1 ($V_{G1}$) is greater than the data line voltage $V_D$ but less than the voltage at common node G2 ($V_{G2}$).

FIG. 4B shows an example TS memristor-based aCAM cell assembly 400B in accordance with embodiments of the present disclosure. As seen in FIG. 4B, utilizing TS memristors 202a, 202b allows for the removal of the second (T2) and sixth (T6) transistors from the aCAM cell 410. Accordingly, TS memristors 202a, 202b enable an aCAM cell to be implemented in a four transistor and two memristor (4T2M) design. This reduces the overall size of the TS memristor-based aCAM cell assembly 400B because the relatively large transistors used to signal a mismatch (e.g., FETs) are removed, reducing the footprint for each TS memristor-based aCAM cell assembly 400B in an aCAM. The removal of the two transistors enables aCAM cell assembly 400B to save on space because TS memristors are smaller and in various embodiments are capable of being built three-dimensionally. This also reduces the overall power consumption. The major portion of the power is consumed by charging the capacitance of the transistors and connection wires. Removing some large power consuming devices from TS memristor-based aCAM cell assembly 400B thereby reduces the amount of power required. Moreover, using pull-up TS memristors rather than traditional pull-down transistors further reduces power consumption by limiting the number of connection wires which need to be charged at a given time. Using pull-down transistors requires match lines to be precharged, and remain in the high logic state until a mismatch is sensed.

As shown in FIG. 4B, a first end of first TS memristor 202a is connected to common node G1, while the second end of TS memristor 202a is connected to the match line ML. Similarly, a first end of second TS memristor 202b is connected to common node G2, while the second end of TS memristor 202b is connected to the match line ML. In various embodiments, first TS memristor 202a can be configured with a threshold voltage $V_{th}$ representing the low value ($R_{low}$) and second TS memristor 202b can be configured with a threshold voltage $V_{th}$ representing the high value ($R_{high}$). In this way, first TS memristor 202a and second TS memristor 20b define the range $R_{range}$ and will only pull up the match line ML if the data line voltage $V_{DL}$ falls below $R_{low}$ (i.e., pulled-up by first TS memristor 202a) or exceeds $R_{high}$ (i.e., pulled-up by second TS memristor 202b), thereby signaling a mismatch. Because TS memristors 202a, 202b reduce the impact of subthreshold voltage (as well as operating the match line ML in a discharge state for the search), the search capable is more accurate because first TS memristor 202a and second TS memristor 202b are less susceptible to the subthreshold leakage causing an unintentional switch to the ON state and signalling a mismatch when it is really a match. Accordingly, the probability of a false mismatch being signaled is minimized. Although shown outside of aCAM bit cell 410, in other embodiments first TS memristor 202a, second TS memristor 202b, or a combination of both can be included within aCAM bit cell 410. In various embodiments, TS memristors 202a, 202b can be the kind of memristor as first memristor M1 and second memristor M2, whereas in other embodiments TS memristors 202a, 202b can be a different type of memristor from first and second memristors M1, M2.

Figure 5A:
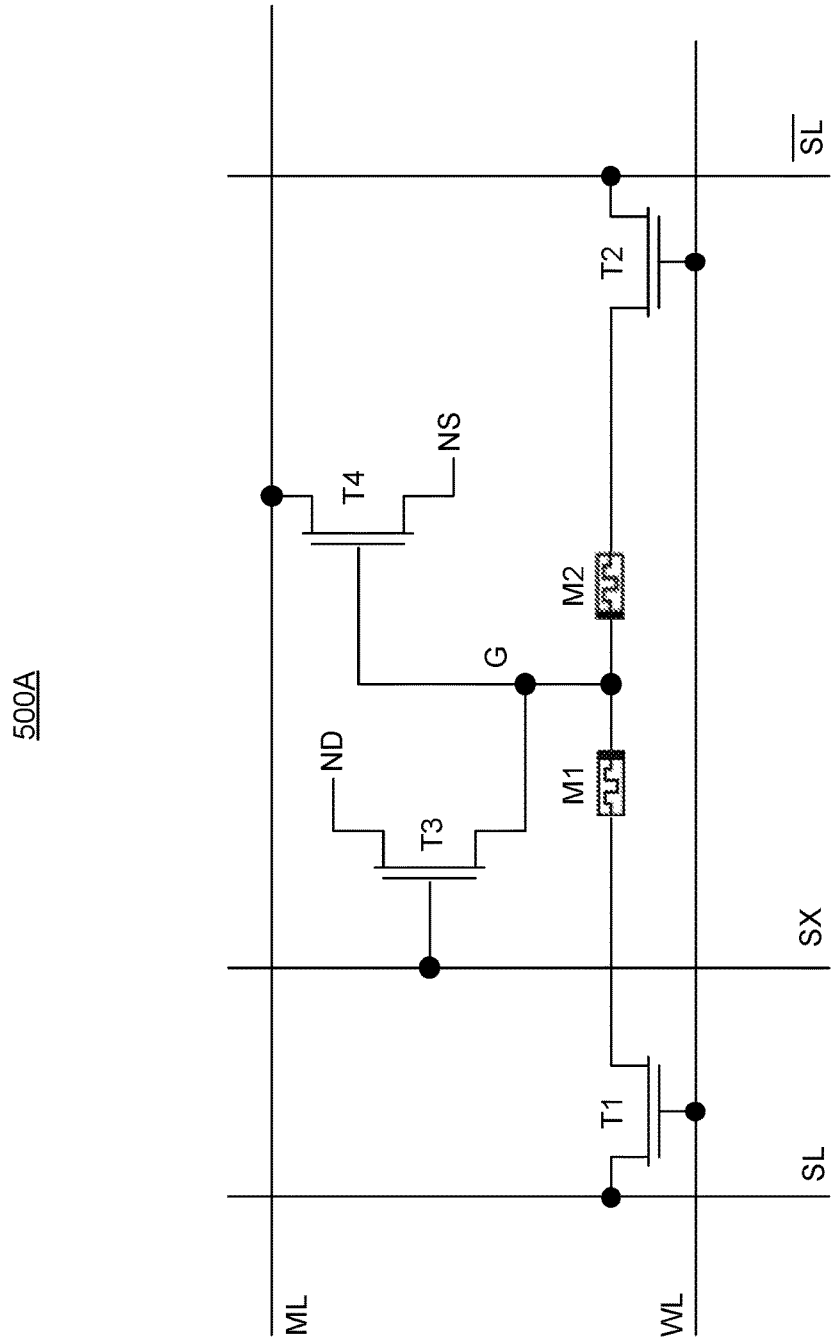
FIG. 5A shows a prior art memristor-based content addressable memory (mCAM).
Figure 5B:
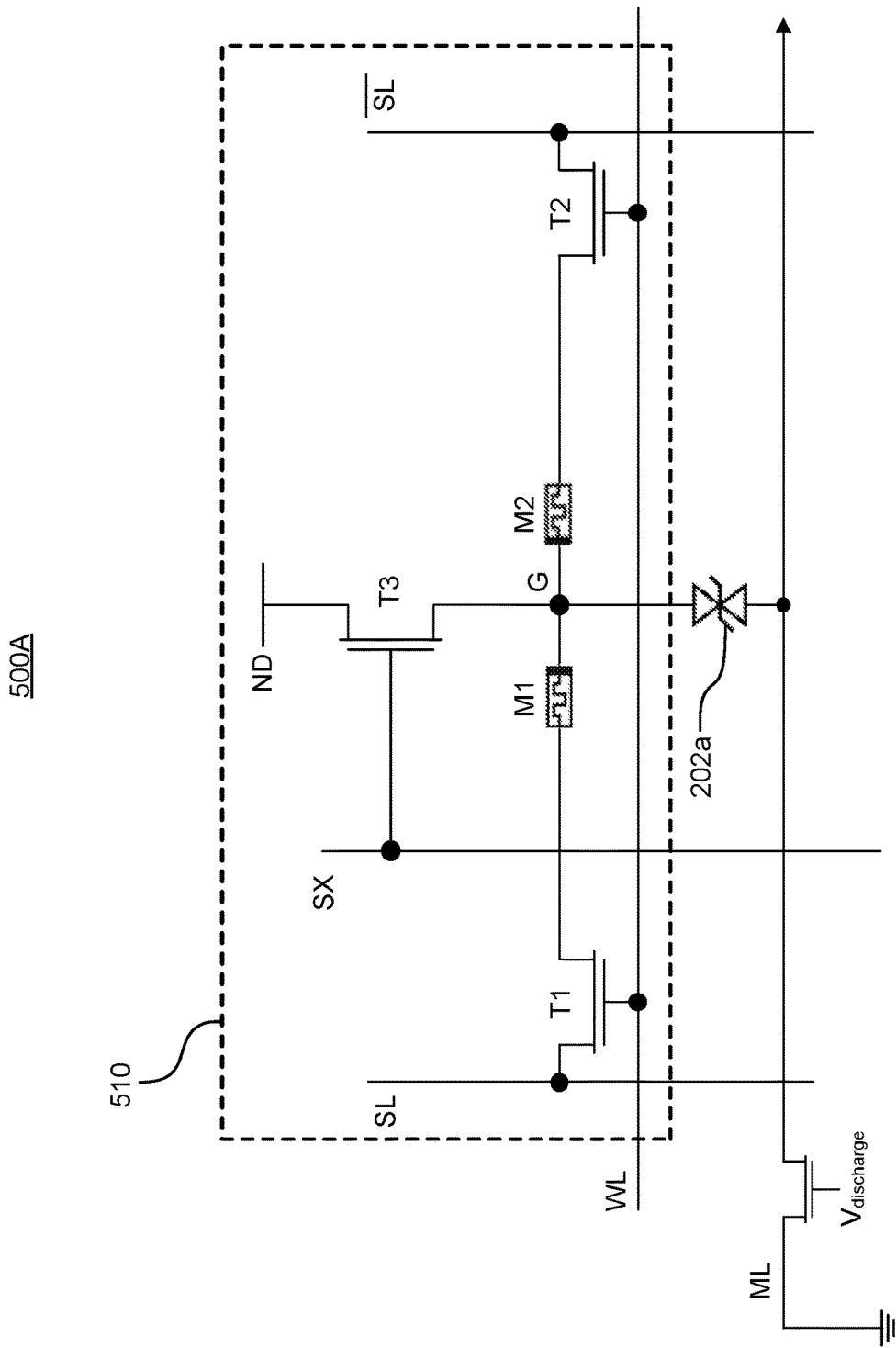
FIG. 5B shows an example TS memristor-based mCAM cell assembly in accordance with embodiments of the technology disclosed herein.

FIGS. 5A and 5B illustrate another example implementation of TS memristors, this time in a TCAM implementation, in accordance with embodiments of the present disclosure.

FIGS. 5A and 5B are provided for illustrative purposes and should not be interpreted as limiting the scope of the technology to only the embodiment shown. As illustrated in FIG. 5A, the example prior art TCAM cell 500A comprises a four transistor and two memristor (4T2M) TCAM cell, with a first transistor T1 connected to a first data line SL and a second transistor T2 connected to a second data line $\overline{SL}$. The first memristor is connected to the first transistor T1 and the second memristor M2 is connected to the second transistor T2. The first and second memristors M1, M2 are connected in series to form a resistive divider, with the output voltage of the resistive divider (i.e., voltage on common node G) being applied to the gate of a match-line transistor T4 to control whether to switch the match-line transistor T4 to pull down the voltage on match line ML. The third transistor T3 works in concert with the first transistor T1 and/or second transistor T2 for programming the memristors M1, M2.

Utilizing a TS memristor in accordance with the technology disclosed herein, the same operation is attainable with only three transistors, reducing the size and power consumption of the cell. FIG. 5B illustrates an example TS memristor-based TCAM cell assembly 500B in accordance with embodiments of the present disclosure. As shown, the assembly 500B includes a modified TCAM cell 510, which comprises a three transistor and two memristor (3T2M) cell compared to the 4T2M cell discussed with respect to FIG. 5A. The operation of modified TCAM cell 510 is the same as that of TCAM cell 500A of FIG. 5A, but instead of the match-line transistor designed to pull down the voltage on the match line ML if there is a mismatch, a TS memristor 202a is connected between the common node G and the match line ML to pull up the voltage on the match line ML in the event of a mismatch. The memristors M1, M2 are still connected in series to form a resistive divider, with a first end of each memristor M1, M2 connected to the first data line SL and second data line $\overline{SL}$, respectively, and the second end of each memristor M1, M2 connected to common node G. The voltage at common node G still controls signalling of a mismatch, as in TCAM cell 500A, but instead of controlling a larger transistor the voltage controls whether to switch TS memristor 202a into the ON state and apply voltage to the match line ML.

Figure 6:
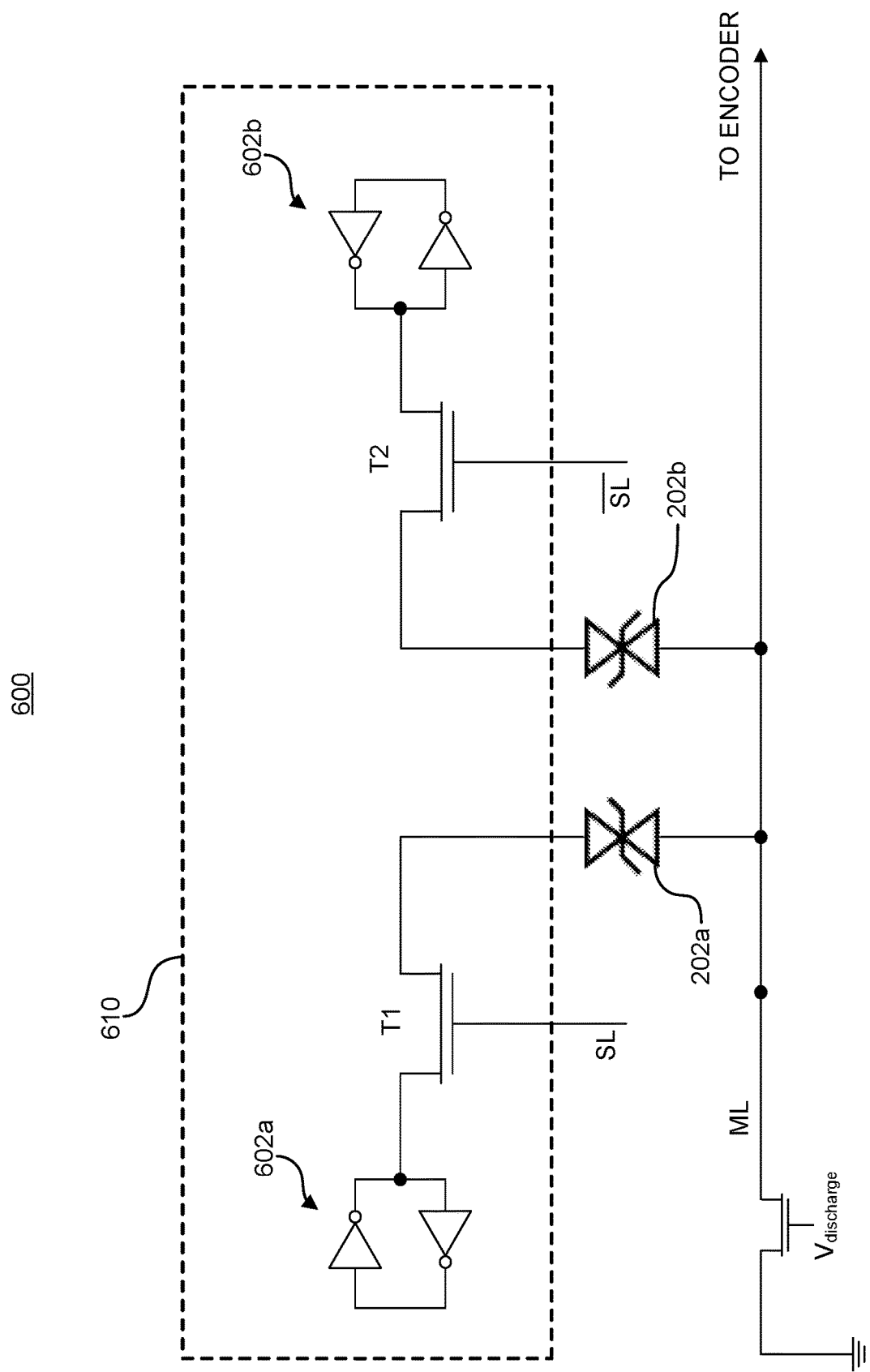
FIG. 6 shows an example TS memristor-based static random access memory content addressable memory (SRAM CAM) cell assembly in accordance with embodiments of the technology disclosed herein.

Although discussed with respect to memristor-based example CAMS with respect to FIGS. 4A-4B and 5A-5B, the technology disclosed herein is not limited only to memristor-based CAMs but is directly applicable to conventional static random access memory (SRAM)-based CAMs. The issue of subthreshold leakage is present in any situation where a large number of transistors are present and associated with a common match line. Traditional SRAM-based CAM cells comprise a total of 16 transistors comprising storage and memory circuitry. The impact of sub-threshold leakage in this environment limits the potential size of data words that can be effectively stored and searched to only 8- or 16-bits. FIG. 6 illustrates an example SRAM-based CAM cell assembly 600 with TS memristors in accordance with the technology disclosed herein. For ease of discussion, only the portion of SRAM-based CAM cell assembly 600 which concerns operation of the TS memristors is shown. Although not shown, a person of ordinary skill in the art would know that the SRAM-based CAM cell 610 would comprise a plurality of other transistors and circuitry as commonly found in SRAM-based circuits, and the omission of such additional components and devices in FIG. 6 should not be interpreted as limiting the scope of the technology or the sufficiency of the disclosure.

As shown in FIG. 6, the left side circuit 602*a* is connected to a first end of the first TS memristor 202*a* through a first switching transistor T1, and the right side circuit 602*b* is connected to a first end of the second TS memristor 202*a* through a second switching transistor T2. The TS memristors 202*a*, 202*b* operate in a manner similar to that discussed above with respect to FIGS. 1-3, staying in the OFF state unless a mismatch is detected. Each TS memristor 202*a*, 202*b* is controlled by the voltage across the respective transistor T1, T2 indicating the result of the search. During a search, different voltages are applied to the data lines SL, $\overline{SL}$, based on the search criteria. The operation of each circuit 602*a*, 602*b* (each comprising two transistors) and the switching transistors T1, T2 functions in the same way as a traditional SRAM-based CAM cell in the art. However, rather than having two switching transistors connected to the match line ML (one each for signaling a mismatch from the left side circuit 602*a* or the right side circuit 602*b*) the signaling is controlled by the TS memristors 202*a*, 202*b*. Moreover, as with the other examples, the match line ML operates from a discharged state rather than the pre-charged state in the prior art. The TS memristors 202*a*, 202*b*, being less susceptible to the non-zero subthreshold current leakage due to the TS memristor's significantly smaller conductance swing compared to traditional FETs, thereby enables a greater number of SRAM-based CAM cells 610 to be connected to a common match line ML. Therefore, the word length capable by a given CAM is increased because the impact of additive sub-threshold leakage is mitigated through the TS memristors and pulling up the match line ML rather than pulling down the match line ML.

Figure 7:
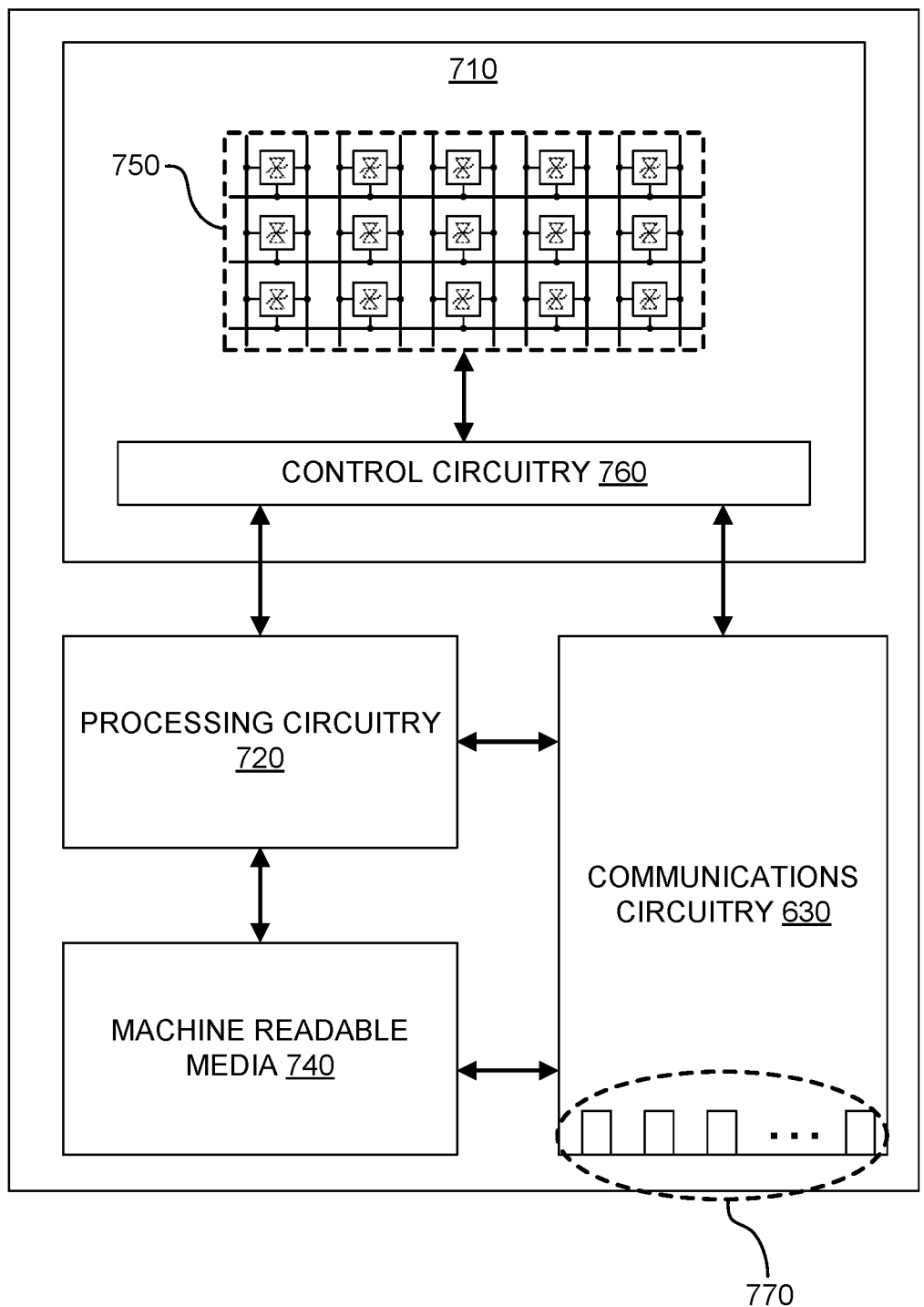
FIG. 7 illustrates an example device in accordance with embodiments of the technology disclosed herein.

FIG. 7 illustrates an example device 700 in which an example CAM with TS memristors, such as the various example CAMs discussed with respect to FIGS. 1-6, can be implemented. In various embodiments, device 700 can comprise any number of different computing devices known in the art that suitable for implementing content addressable memory, including but not limited to servers, network switches, gateway devices, among other devices. For ease of discussion, certain aspects of example device 700 shall be described below under the assumption device 700 comprises a network device (e.g., switch, gateway, etc.), but it should be understood that device 700 could be any type of electronic device. For ease of discussion, components of device 700 which are commonly used in devices of the kind and which are not related to the functionality of a content addressable memory implementation are omitted, but this omission should not be interpreted as limiting the scope of the disclosure as excluding those component from the scope of the issued claims.

As shown in FIG. 700, device 700 includes a CAM 710, processing circuitry 720, communications circuitry 730, and a machine readable media 740. In various embodiments, CAM 600 can comprise a plurality of CAM cell assemblies similar to any of the example CAM assemblies discussed with respect to FIGS. 3-6, or any another type of CAM cell type. An array of CAM cells 750 can be included, the array representing one or more data words, similar to those discussed with respect to FIGS. 1-3. In various embodiments, CAM 710 can include control circuitry 760.

Figure 8:
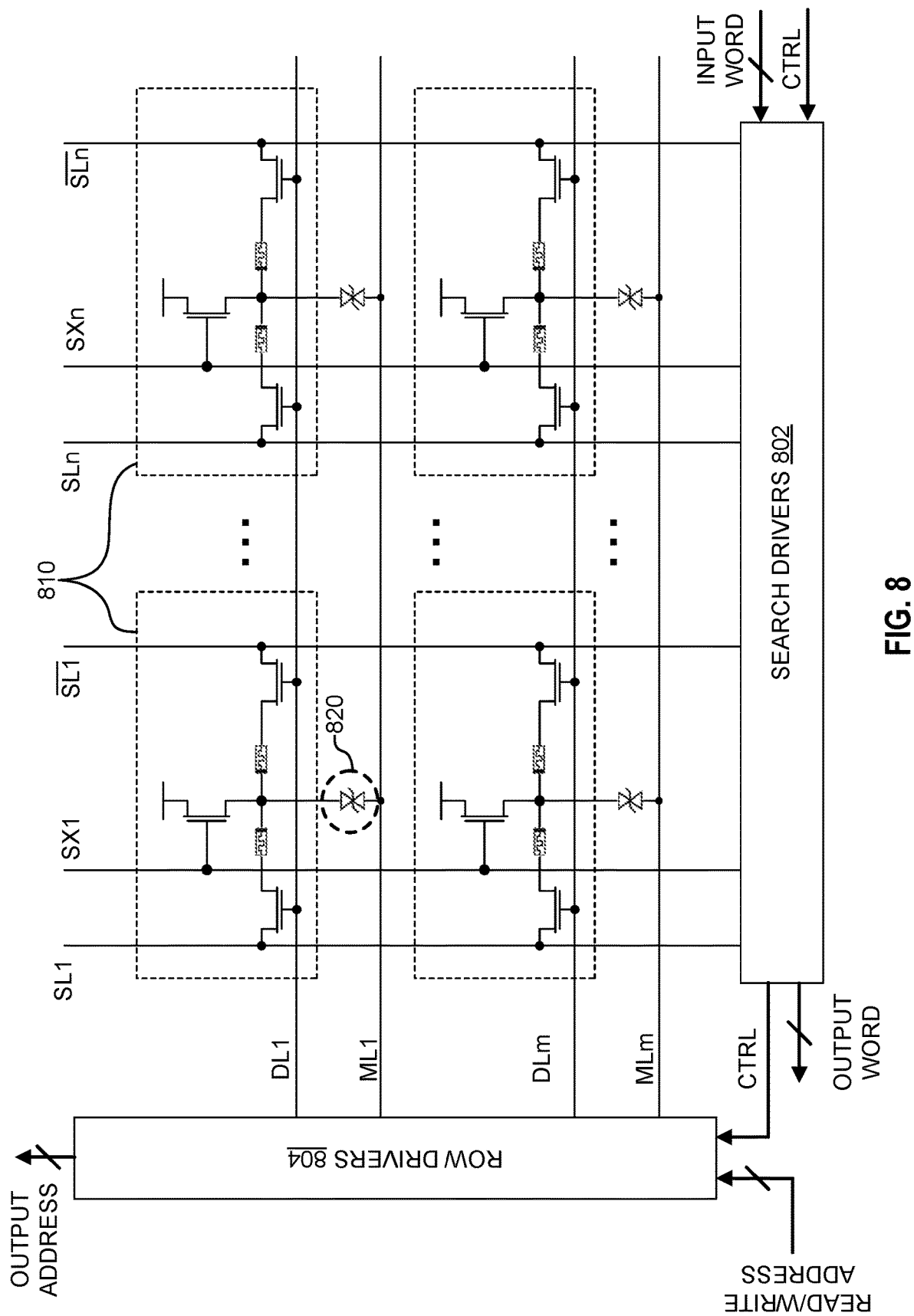
FIG. 8 shows an example TS memristor-based CAM including example control circuitry in accordance with embodiments of the technology disclosed herein.

FIG. 8 shows an example CAM 710, including example control circuitry 760 (comprising column drivers 810 and row driver 820), in accordance with embodiments of the present disclosure. For ease of discussion, example CAM 710 shall be discussed with respect to an embodiment wherein the TS memristor is connected to. As illustrated, CAM 710 comprises an array of CAM cells 750, the array comprising M rows and N columns. Each CAM cell 810 is connected to its respective match line ML by at least one TS memristor 820. Each row of CAM 710 represents one word storage block. CAM 710 can comprise a plurality of data lines DL1-DLm, a plurality of match lines ML1-MLm, a plurality of first data lines SLn, a plurality of second data lines SLn, and a plurality of third data lines SXn. In other embodiments, a plurality of word lines WL1-WLm may be present in lieu of or in addition to data lines DL1-DLm. Because there is one word storage block per row (i.e., each row represents one data word), the length of data words are limited by the number CAM cells 810. Each M column corresponds to a specific bit position (e.g., bit 0, bit 1, bit 7, etc.) of the data word. The data value stored in a given CAM cell 810 corresponds to a specific bit of a word that is stored in the word storage block that includes the given CAM cell 810, with the position of the bit within the stored word being determined by the bit position of the column in which the respective CAM cells 810 are disposed.

In various embodiments, control circuitry 760 applies signals to the various wiring lines mentioned above so as to control operations of CAM cells 810, such as read, write, and search operations. As illustrated in FIG. 8, control circuitry 760 of FIG. 7 is illustrated as comprising column driver 810 and row driver 820. Row driver 820 may include one or more drivers, shift registers, decoders, and the like that are connected to and drive wiring lines that correspond to rows of the array of CAM cells 810. In various embodiments, row driver 820 can include the encoder 304 discussed with respect to FIG. 3. Column driver 810 may include one or more drivers, shift registers, decoders, and the like that are connected to and drive wiring lines that correspond to columns of the array of CAM cells 810.

Row driver 820 can be connected to data lines DL1-DLm and match lines ML1-MLn and be configured to supply or sense electrical signals carried on these wiring lines. For example, the row driver 820 may include decoders and drivers that are to select one of the word storage blocks by applying the positive supply voltage $V_{DD}$ to one of date lines DL1 DLm based on an input read/write address during a read or write operation. During a search operation, row driver 820 can be configured to apply the positive supply voltage $V_W$ to all of data lines DL1-DLn. In some embodiments, row driver 820 can include one or more decoders or drivers that are to, during a search operation, discharge all of match lines ML1 MLm, sense which match lines of the plurality of match lines ML1-MLm do or do not have their voltage pulled high (up), indicating a TS memristor 820 switched to the ON state, and output addresses of any word storage block whose match line ML1 MLm were not pulled low. The plurality of TS memristors 820 in the array of CAM cells 650 can operate in a manner similar to that discussed above with respect to FIGS. 1-6.

Column driver 810 in various embodiments may be connected to the plurality of first data lines SLn, the plurality of second data lines SLn, and the plurality of third data lines SXn, and may supply electrical signals to and/or sense electrical signals carried on these wiring lines. For example, column driver 810 can include decoders and drivers that are to selectively apply the variety of voltages discussed above with respect to FIGS. 1-6.

It should be understood that separate drivers could be provided to drive different types of wiring lines (e.g., one driver drives first data lines SL and a separate driver drives second data lines SLn), or that a single driver could be provided to drive multiple different types of wiring lines (e.g., a single driver drives both the first data lines SL and second data lines SLn). Furthermore, it should be understood that the various components of control circuitry 760 could be physically located on any side or combination of sides of the array of CAM cells 810, and that the relative locations illustrated in FIG. 8 are not intended to imply physical locations of the components in a physical device that instantiates the example CAMs discussed with respect to this disclosure.

Referring back to FIG. 7, Processing circuitry 720 may supply the control signal to the control circuitry 760. Processing circuitry 720 can be any circuitry capable of executing non transitory machine readable instructions, such as a central processing unit (CPU), a microprocessor, a micro-controller, a digital signal processor (DSP), etc. Processing circuitry 620 may also be an application-specific integrated circuit (ASIC), a field-programmable gate array (FPGA), an application-specific instruction set processor (ASIP), or the like, that is configured to perform certain operations. In various embodiments, control circuitry 760 may be included within processing circuitry 720.

Figure 9:
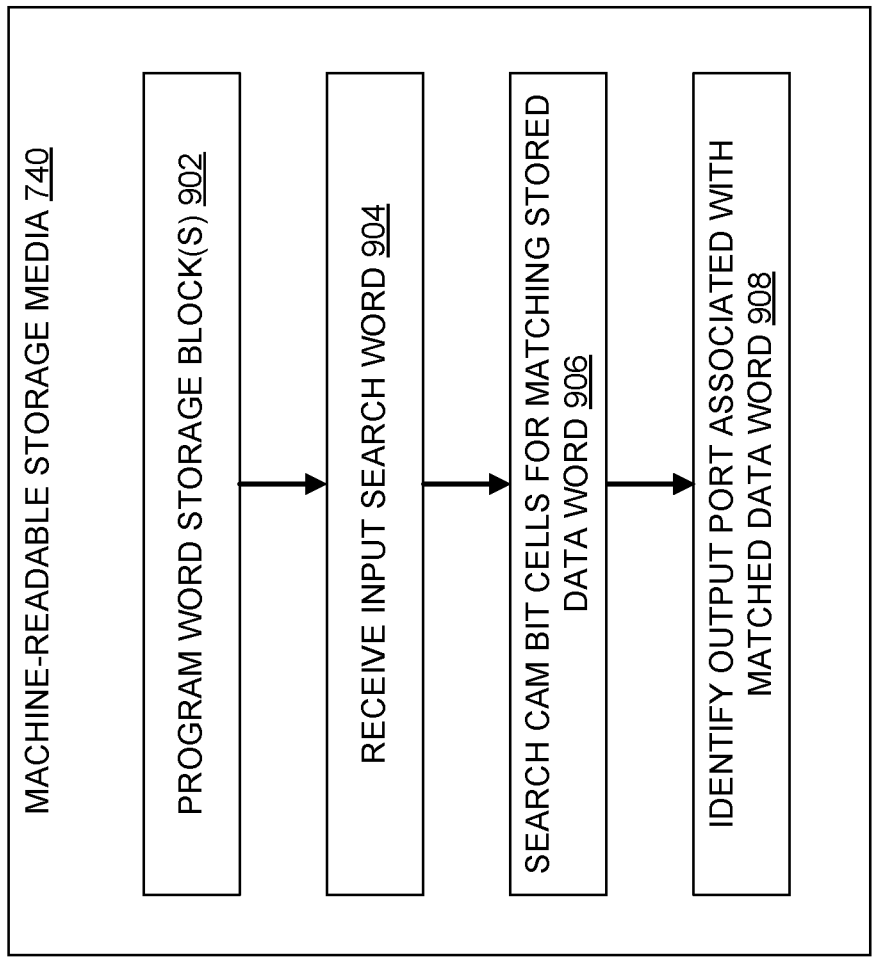
FIG. 9 illustrates an example machine-readable storage media with instructions in accordance with embodiments of the technology disclosed herein.

Machine readable media 740 can be any non-transitory machine readable medium, including but not limited to volatile storage media (e.g., dynamic RAM (DRAM), SRAM, etc.) and/or non-volatile storage media (e.g., PROM, EPROM, EEPROM, NVRAM, hard drives, etc.). Non-limiting examples include: flash memory, solid state storage devices (SSDs); a storage area network (SAN); removable memory (e.g., memory stick, CD, SD cards, etc.); or internal computer RAM or ROM; among other types of computer storage mediums. Machine-readable media 740 can store machine readable instructions that, when executed by processing circuitry 710, cause device 700 to perform one or more operations, such as the programming, searching, and reading operations discussed above. As a non-limiting example, machine readable media 740 can store instructions causing the processor to control the actions of control circuitry 760, executing a search operation through control circuitry 760. FIG. 9 illustrates an example machine-readable storage media 740 in accordance with embodiments of the technology disclosed herein. As shown, machine-readable storage media 740 can be configured to store instructions executable by hardware processors, such as the processing circuitry discussed with respect to FIG. 7. The instructions stored on machine-readable storage media 740 illustrated in FIG. 9 may include various sub-instructions for performing the function embodied by the identified instructions. For example, the instruction "program word storage block(s)" 906 may include various sub-instructions for determining which word storage blocks to program and the required voltages for storing specific data values in each bit cell of a word storage block in a manner known in the art. The instruction "receive input search word" 904 can include various sub-instructions for receiving a communication data packet from another source over communications circuitry similar to the reception discussed with respect to FIG. 7 above. Moreover, receiving the input search word may comprise retrieving a destination address from the received communication data packet as discussed with respect to the search procedure discussed with respect to FIG. 1, as well as sub-instructions for discharging the match lines so that the match lines indicate low logic indicative of a match. The instruction "search CAM bit cells for matching stored data words" 906 can include sub-instructions for performing the search procedure in a manner as that discussed with respect to FIG. 1, including identifying the destination address of a received communications data packet, sending a control signal from the processing circuitry to control circuitry of the CAM, applying the necessary voltages to the wiring lines associated with each bit cell based on the search criterion (i.e., the bits of the comparand), and determining a best matched word storage block of the CAM array. The instruction "identify output port associated with matched data word" 908 can include sub-instructions for determining which output port is associated with the best matched word storage block identified through the search operation in a manner similar to that discussed with respect to FIG. 1. In some embodiments, identifying the output port may be performed by control circuitry of the TAM or by communications circuitry in a manner similar to that discussed with respect to FIG. 1.

Communications circuitry 730 can include transceiver circuitry for receiving input data communications and transmitting output data communications. In various embodiments, communications circuitry 730 can comprise a network interface card (NIC) including a plurality of different communication ports in compliance with a plurality of different communication standards. In various embodiments, communications circuitry 730 can include a plurality of communications ports 770, which can serve to connect multiple other electronic devices to one another via device 700. As a non-limiting example, device 700 could be a network router, switch, gateway, or other routing device for a network, and may perform various traffic control tasks such as routing, switching, etc.

In some embodiments, communications circuitry 730 can determine which communication port 770 to forward the received communication to the destination address identified in the received data packet. Device 700 can utilize CAM 710 to identify the communications port 770 to which to send a received data packet by searching CAM 710 using the destination address in the received data packet. For example, device 700 may be connected in a network to a plurality of other devices, each of the other devices having a unique address (e.g., a unique IP address). Device 700 may store this information in CAM 710 such that the location of the stored device address within CAM 710 corresponds to a specific communications port 770 through which device 700 and a particular other device are connected. Each stored word in CAM 710 can correspond to a different communications port 770. In various embodiments, when a new device is connected to device 700, the unique address for the newly added device can be written to a data word of CAM 710. Upon receipt of a new data communication (packet), a destination address included within the received data packet is extracted and sent to CAM 710 directly from communications circuitry 730 in some embodiments, while in other embodiments the destination address may be provided indirectly through processing circuitry 720. The destination address serves as the input comparand for conducting the CAM search. If a match is identified, CAM 710 returns a memory address (e.g., an location within RAM) to communications circuitry 730, either directly or through processing circuitry 720. Because each data word of CAM 700 corresponds to a particular communications port 770 of communications circuitry 730, the memory address of the stored data word associated storage block can be understood by communications circuitry to identify a particular communications port 770, and therefore the communications circuitry 730 can determine which communications port 770 to forward the communication packet based on the output address of TCAM 710.

In the art, the term "memristor" may be used in certain contexts in abroad sense and may be used in certain contexts in a narrow sense. In a narrow sense, "memristor" may refer specifically to circuit elements that exhibit a non-linear relationship between electric charge and magnetic flux (or exhibit a relationship between the time integral of current and the time integral of voltage). In a broad sense, "memristor" refers broadly to any non-volatile memory element that is based on changing resistance states and is read by its resistance. Herein and in the appended claims, "memristor" is always used in the broad sense, unless specifically indicated otherwise. Specifically, as used herein, "memristor" refers broadly to any non-volatile memory element that is based on changing resistance states and is read by its resistance. Thus, memristors M1, M2 can each be, for example, a memristor in the narrow sense of the term, a memory element that changes the resistance across a dielectric solid-state material, a resistive random access memory element (sometimes referred to as a RRAM or ReRAM), a phase-change memory element (sometimes referred to as PCM of PCRAM), a conductive bridging memory element (sometimes referred to as CBRAM or a programmable metallization cell), a magnetoresistive memory element (sometimes referred to as MRAM), amongst others.

The example CAMs are described herein and illustrated in the drawings in a conceptual or schematic manner to aid understanding. In particular, physical structures in the example CAMs are referred to and/or illustrated conceptually herein as circuit components, and the relationship between these circuit components are illustrated in circuit diagrams in accordance with the usual practice in the art. Circuit components are conceptual representations of classes of physical structures or devices that perform certain functions and/or have certain properties. Examples of such circuit components include passive devices such as resistors, capacitors, memristors, etc.; active devices such as transistors, diodes, etc.; constituent elements of the active/passive devices such as terminals, electrodes, gates, sources, drains, etc.; elements that connect devices such as wiring lines, nodes, etc.; amongst others. It should be understood that a single physical structure (or set of physical structures) in an actual physical incarnation of an example CAM in accordance with the technology disclosed herein can serve multiple functions and/or have multiple properties, and thus a single physical structure (or a set of physical structures) may be described and/or illustrated herein as multiple distinct circuit components. For example, a single piece of metal in a particular physical incarnation of an example CAM can serve as both a gate electrode of a transistor and as a wiring line. Thus, the fact that two or more circuit components may be referred to or illustrated herein as distinct components should not be interpreted to mean that their corresponding physical structures in a physical incarnation of the example CAM are distinct structure. Although several examples are provided, a person of ordinary skill in the art would understand that the embodiments are applicable for any type of CAM.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A content addressable memory (CAM) comprising:
   a processing circuitry;
   an array of a plurality of CAM cells communicatively coupled to the processing circuitry;
   a plurality of threshold switching (TS) memristors, at least one TS memristor configured to connect to each of the plurality of CAM cells;
   each TS memristor comprising one of a diffusive memristor, a metal-insulator transition (MIT) device, a Zener diode, a mixed ionic-electronic conducting (MIEC) device;
   each of the TS memristors comprising a first end connected to a CAM cell of the plurality of CAM cells and a second end connected to a match line; and
   a discharge transistor connected to the match line, the discharge transistor configured to discharge any charge on the match line in response to the CAM receiving a command to perform a search.

2. The CAM of claim 1, wherein the CAM is configured as one of a binary CAM, a ternary CAM, an analog CAM, a static random access memory (SRAM) CAM.

3. The CAM of claim 1, further comprising a control circuitry to perform one or more operations of write, read, or search the plurality of CAM cells.

4. The CAM of claim 3, the control circuitry configured to perform a search operation in response to receiving an instruction from the processing circuitry.

5. The CAM of claim 1, wherein each CAM cell of the plurality of CAM cells is connected to two TS memristors.

6. The CAM of claim 1, each TS memristor configured to switch from an OFF state to an ON state when a voltage across a respective TS memristor exceeds a threshold voltage of the respective TS memristor.

7. The CAM of claim 1, wherein each TS memristor is further configured to switch from an ON state to an OFF state when a voltage across the respective TS memristor falls below a hold threshold.

8. The CAM of claim 1, each CAM cell comprising:
a first memristor connected in series to a second memristor, wherein:
a first end of the first memristor is connected to a first CAM cell switching transistor;
a first end of the second memristor is connected to a second CAM cell switching transistor; and
a second end of the first memristor and a second end of the second memristor are connected together at a common node;
wherein a TS memristor is connected between the common node and the match line and configured to switch from an OFF state to an ON state when a voltage on the common node exceeds a threshold voltage of the TS memristor.

9. A device comprising:
a processing circuitry;
a communications circuitry communicatively coupled to the processing circuitry;
a content addressable memory (CAM) communicatively coupled to the processing circuitry and the communications circuitry, the CAM comprising:
an array of a plurality of CAM cells communicatively coupled to a control circuitry of the CAM;
a plurality of threshold switching (TS) memristors, at least one TS memristor configured to connect to each of the plurality of CAM cells;
each TS memristor comprising one of a diffusive memristor, a metal-insulator transition (MIT) device, a Zener diode, a mixed ionic-electronic conducting (MIEC) device;
each of the TS memristors comprising a first end connected to a CAM cell of the plurality of CAM cells and a second end connected to a match line; and
a discharge transistor connected to the match line, the discharge transistor configured to discharge any charge on the match line in response to the CAM receiving a command to perform a search.

10. The device of claim 9, wherein the CAM is configured as one of a binary CAM, a ternary CAM, an analog CAM, a static random access memory (SRAM) CAM.

11. The device of claim 9, wherein the control circuitry configured to perform a search operation in response to receiving an instruction from the processing circuitry.

12. The device of claim 9, wherein each TS memristor configured to switch from an OFF state to an ON state when a voltage across a respective TS memristor exceeds a threshold voltage of the respective TS memristor.

13. The device of claim 9, wherein each TS memristor is further configured to switch from an ON state to an OFF state when a voltage across the respective TS memristor falls below a hold threshold.

14. The device of claim 9, each CAM cell comprising:
a first memristor connected in series to a second memristor, wherein:
a first end of the first memristor is connected to a first CAM cell switching transistor;
a first end of the second memristor is connected to a second CAM cell switching transistor; and
a second end of the first memristor and a second end of the second memristor are connected together at a common node;
wherein a TS memristor is connected between the common node and the match line and configured to switch from an OFF state to an ON state when a voltage on the common node exceeds a threshold voltage of the TS memristor.

15. The device of claim 9, each CAM cell comprising:
a high side comprising:
a first memristor having a first end connected to a high data line and a second end connected to a high-side common node;
a first switching transistor having a first side connected to a low data line and a second side connected to the high-side common ground; and
a first TS memristor having a first end connected to a match line and a second end connected to the high-side common node;
a low side comprising:
a second memristor having a first end connected to the high data line and a second end connected to a low-side common node;
a second switching transistor having a first side connected to the low data line and a second side connected to the low-side common ground; and
a second TS memristor having a first end connected to the match line and a second end connected to the low-side common node.

16. A content addressable memory (CAM) comprising:
an array of a plurality of CAM cells, each CAM cell comprising:
a high side comprising:
a first memristor having a first end connected to a high data line and a second end connected to a high-side common node;
a first switching transistor having a first side connected to a low data line and a second side connected to the high-side common ground; and
a first TS memristor having a first end connected to a match line and a second end connected to the high-side common node;
a low side comprising:
a second memristor having a first end connected to the high data line and a second end connected to a low-side common node;
a second switching transistor having a first side connected to the low data line and a second side connected to the low-side common ground; and
a second TS memristor having a first end connected to the match line and a second end connected to the low-side common node; and
a discharge transistor connected to the match line, the discharge transistor configured to discharge any charge on the match line in response to the CAM receiving a command to perform a search.

17. The CAM of claim 16, wherein each TS memristor comprise one of a diffusive memristor, a metal-insulator transition (MIT) device, a Zener diode, a mixed ionic-electronic conducting (MIEC) device.

18. The CAM of claim 16, each TS memristor configured to switch from an OFF state to an ON state when a voltage across a respective TS memristor exceeds a threshold voltage of the respective TS memristor.

19. The device of claim 9, wherein each CAM cell of the plurality of CAM cells is connected to two TS memristors.

20. The CAM of claim 16, wherein each CAM cell of the plurality of CAM cells is connected to two TS memristors.

* * * * *